(12) United States Patent
Roy et al.

(10) Patent No.: US 10,297,314 B2
(45) Date of Patent: May 21, 2019

(54) SYSTEMS AND METHODS FOR NON-VOLATILE FLIP FLOPS

(71) Applicant: FREESCALE SEMICONDUCTOR, INC., Austin, TX (US)

(72) Inventors: Anirban Roy, Austin, TX (US);
Michael A. Sadd, Austin, TX (US)

(73) Assignee: NXP USA, Inc., Austin, TX (US)

( * ) Notice: Subject to any disclaimer, the term of this patent is extended or adjusted under 35 U.S.C. 154(b) by 352 days.

(21) Appl. No.: 15/163,801

(22) Filed: May 25, 2016

(65) Prior Publication Data

US 2017/0345491 A1  Nov. 30, 2017

(51) Int. Cl.
| | |
|---|---|
| G11C 29/00 | (2006.01) |
| G11C 13/00 | (2006.01) |
| G06F 3/06 | (2006.01) |
| G06F 11/10 | (2006.01) |
| G11C 29/52 | (2006.01) |

(Continued)

(52) U.S. Cl.
CPC ............ G11C 13/004 (2013.01); G06F 3/064 (2013.01); G06F 3/0619 (2013.01); G06F 3/0679 (2013.01); G06F 11/1068 (2013.01); G11C 11/005 (2013.01); G11C 11/1659 (2013.01); G11C 11/1673 (2013.01); G11C 11/2259 (2013.01); G11C 11/2273 (2013.01); G11C 13/003 (2013.01); G11C 13/0023 (2013.01); G11C 13/0038 (2013.01); G11C 13/0069 (2013.01); G11C 29/52 (2013.01); G11C 2213/78 (2013.01); G11C 2213/79 (2013.01); G11C 2213/82 (2013.01)

(58) Field of Classification Search
CPC . G11C 13/004; G11C 11/005; G11C 11/1659;
G11C 11/1673; G11C 11/2259; G11C 11/2273; G11C 13/0023; G11C 13/003; G11C 13/0038; G11C 13/0069; G11C 29/52; G11C 2213/78; G11C 2213/79; G11C 2213/82; G06F 3/0619; G06F 3/064; G06F 3/0679; G06F 11/1068
USPC .......................................... 714/763, 764, 766
See application file for complete search history.

(56) References Cited

U.S. PATENT DOCUMENTS

| | | | | |
|---|---|---|---|---|
| 5,388,073 A | * | 2/1995 | Usami ...................... | G11C 7/22 365/189.04 |
| 5,548,559 A | * | 8/1996 | Mochizuki ............... | G11C 8/12 365/230.03 |

(Continued)

OTHER PUBLICATIONS

Chabi et al., "Ultra Low Power Magnetic Flip-Flop Based on Checkpointing/Power Gating and Self-Enable Mechanisms," IEEE Transactions on Circuits and Systems—I: Regular Papers, vol. 61, No. 6, Jun. 2014, 11 pages.

(Continued)

*Primary Examiner* — Albert Decady
*Assistant Examiner* — Osman M Alshack (57) ABSTRACT

An integrated circuit includes a first plurality of flip flops; a first bank of resistive memory cells, wherein each flip flop of the first plurality of flip flops uniquely corresponds to a resistive memory cell of the first bank of resistive memory cells; write circuitry configured to store data from the first plurality of flip flops to the first bank of resistive memory cells; and read circuitry configured to read data from the first bank of resistive memory cells and provide the data from the first bank for storage into the first plurality of flip flops.

18 Claims, 4 Drawing Sheets

(51) Int. Cl.
  *G11C 11/16* (2006.01)
  *G11C 11/00* (2006.01)
  *G11C 11/22* (2006.01)

(56) References Cited

U.S. PATENT DOCUMENTS

| | | | | |
|---|---|---|---|---|
| 5,694,056 | A * | 12/1997 | Mahoney | H03K 19/17704 |
| | | | | 326/38 |
| 6,571,364 | B1 * | 5/2003 | Maeno | G01R 31/318533 |
| | | | | 714/720 |
| 8,422,295 | B1 | 4/2013 | Lin et al. | |
| 9,147,464 | B1 * | 9/2015 | McKernan | G11C 11/409 |
| 2002/0163837 | A1 * | 11/2002 | Wong | G11C 7/1039 |
| | | | | 365/185.22 |
| 2008/0019188 | A1 * | 1/2008 | Li | G11C 8/10 |
| | | | | 365/185.22 |
| 2009/0073745 | A1 * | 3/2009 | Suzuki | G11C 11/412 |
| | | | | 365/154 |
| 2010/0124105 | A1 * | 5/2010 | Wang | G11C 8/12 |
| | | | | 365/163 |
| 2010/0296329 | A1 * | 11/2010 | Summerfelt | G11C 11/22 |
| | | | | 365/145 |
| 2010/0308876 | A1 * | 12/2010 | Kawasaki | G06F 1/3203 |
| | | | | 327/143 |
| 2012/0092922 | A1 * | 4/2012 | Suzuki | G11C 11/413 |
| | | | | 365/154 |
| 2014/0115243 | A1 * | 4/2014 | Lin | G11C 13/0002 |
| | | | | 711/104 |
| 2015/0009744 | A1 * | 1/2015 | Di Pendina | G11C 14/0081 |
| | | | | 365/148 |
| 2017/0131910 | A1 * | 5/2017 | Paoli | G11C 14/0054 |

OTHER PUBLICATIONS

Na et al., "A Comparative Study of STT-MTJ Based Non-Volatile Flip-Flops," ISCAS, 2013, 4 pages.

U.S. Appl. No. 15/018,095, filed Feb. 8, 2016.

Ikegami et al., "MTJ-Based "Normally-Off Processors" with Thermal Stability Factor Engineered Perpendicular MTJ, L2 Cache Based on 2T-2MTJ Cell, L3 and Last Level Cache Based on 1T-1MTJ Cell and Novel Error Handling Scheme," IEDM Digest, 2015, 4 pages.

Sheng, "SPaC: A Segment-based Parallel Compression for Backup Acceleration in Nonvolatile Processors," Design. Automation and Test in Europe. EDA Consortium. Mar. 18, 2013. pp. 865-868.

\* cited by examiner

SYSTEMS AND METHODS FOR NON-VOLATILE FLIP FLOPS

BACKGROUND

Field

This disclosure relates generally to flip flop circuits, and more specifically, to non-volatile flip flop circuits.

Related Art

In current systems, data in flip flop circuits is retained by supplying auxiliary backup or back-bias voltage to a portion of the flip-clop circuitry. Instead of consuming power to retain flip flop data, it is desirable to provide non-volatile flip flop circuitry that is practical to fabricate and operates efficiently under process, voltage and temperature variations.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Resistive non-volatile memory is used to provide non-volatile flip flop circuitry. Each non-volatile memory cell includes two programmable resistive elements so that data for the flip flop circuitry can be written and read differentially, providing greater accuracy. Data can be read and written in parallel. Read and write time is thus independent of the number of cells being read or written. In addition, resistive non-volatile memory (NVM) cells for storing error correction codes (ECC) and/or parity for each flip-flip circuit can be included. Sense amplifiers are coupled to each bit line to allow all NVM cells associated with a bank of flip flop circuits to be read in parallel. Multiple banks of flip flop circuits can be provided with corresponding NVM cells. The NVM cells are configured in an array and sensed using differential sensing techniques. Very little power is required to retain the state of the flip flop circuits due to the use of the programmable resistive elements, providing an ultra-low power solution for retaining the state of the flip flop circuitry.

Figure 1:
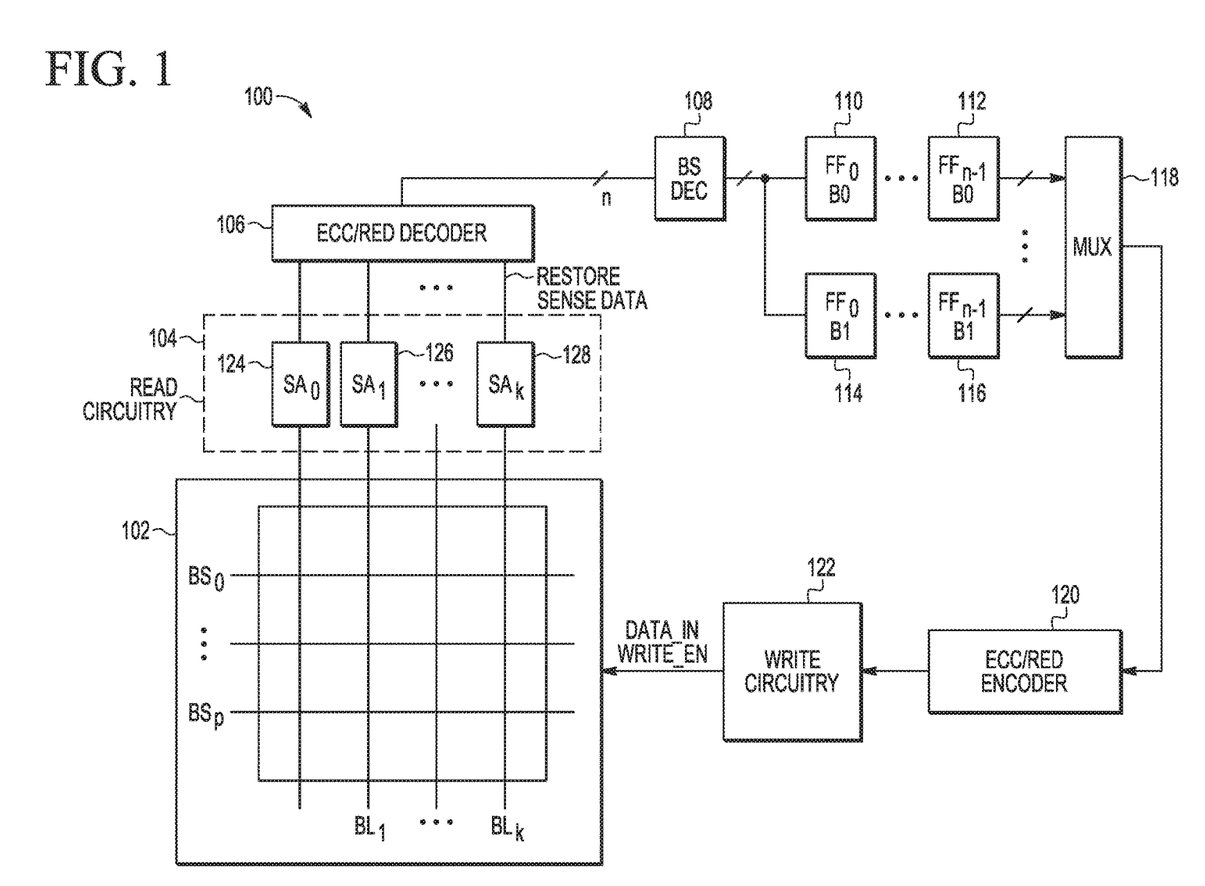
FIG. 1 is a block diagram of a non-volatile memory (NVM) flip flop system in accordance with selected embodiments of the invention.

FIG. 1 is a block diagram of a non-volatile flip flop system 100 in accordance with selected embodiments of the invention that includes non-volatile resistive memory cell array 102, read circuitry 104, error correction code (ECC) and/or redundancy decoder 106, bank select decoder 108, one or more flip flop circuitry banks 110, 112, 114, 116, multiplexer 118, ECC and/or redundancy encoder 120, and write circuitry 122. Each of a plurality of bit lines $BL_1$ through $BL_K$ are coupled between a corresponding column of resistive NVM cells (not shown) in NVM cell array 102 and sense amplifiers 124, 126, 128 in read circuitry 104. Read circuitry 104 provides a restore enable signal and sense data to an optional ECC/redundancy decoder 106. An indicator or address $BS_0, \ldots BS_P$ of a selected bank of flip flop circuits 110-116 can also be provided to ECC and/or redundancy decoder 106 and bank select decoder 108. If ECC and/or parity bits (also referred to as "error correction bits") are added to the sensed data, the error correction bits and the sensed data are provided to bank select decoder 108. Otherwise, just the sensed data and the bank select indicator or address ($BS_0, \ldots BS_P$) can be provided to bank select decoder 108 if ECC and/or parity decoder 106 is not included.

Various types of ECC techniques can be used including single bit error correction methods, such as Hamming code, double bit error correction methods, such as Bose-Chaudhuri-Hocquenghem (BCH) code, or other suitable method. The inventive concepts described herein are not limited to any particular number of flip flop circuits or error correction, redundancy or parity method.

Sense amplifiers 124, 126, 128 in read circuitry 104 are each coupled to a respective one of bit lines $BL_1, \ldots BL_K$. Bank select decoder 108 receives sensed data and ECC/redundancy bits (if ECC or parity is being used), along with a bank select indicator $BS_0, \ldots BS_P$ and restores the data to the selected flip flop bank 110-116. Multiplexer 118 is coupled to receive data from a selected one of flip flop banks 110-116 and, if error correction is being used, provide the data to ECC/redundancy encoder 120, which adds error correction bits to the data from the selected flip flop bank 110-116. The encoded data and ECC information is provided to write circuitry 122 along with the bank select indicator $BS_0, \ldots BS_P$. Otherwise, data from multiplexer 118 and the bank select indicator $BS_0, \ldots BS_P$ can be provided directly to write circuitry 122 if error correction bits are not being used. Write circuitry 122 is configured to write the received data into the selected bank or set of resistive memory cells and the generated error corrections bits to resistive memory cells allocated for error correction bits.

Write circuitry 122 can provide the data from the selected flip flop bank 110-116 along with voltages on source lines (not shown) coupled to the NVM cells, and a write enable indicator, to write the data to the selected bank of NVM cells in NVM array 102 that correspond to the selected flip flop bank 110-116. Depending on the number of bits required for error correction, additional NVM cells are provided in array 102 to store the error correction bits along with the data from the flip flop circuits.

Figure 2:
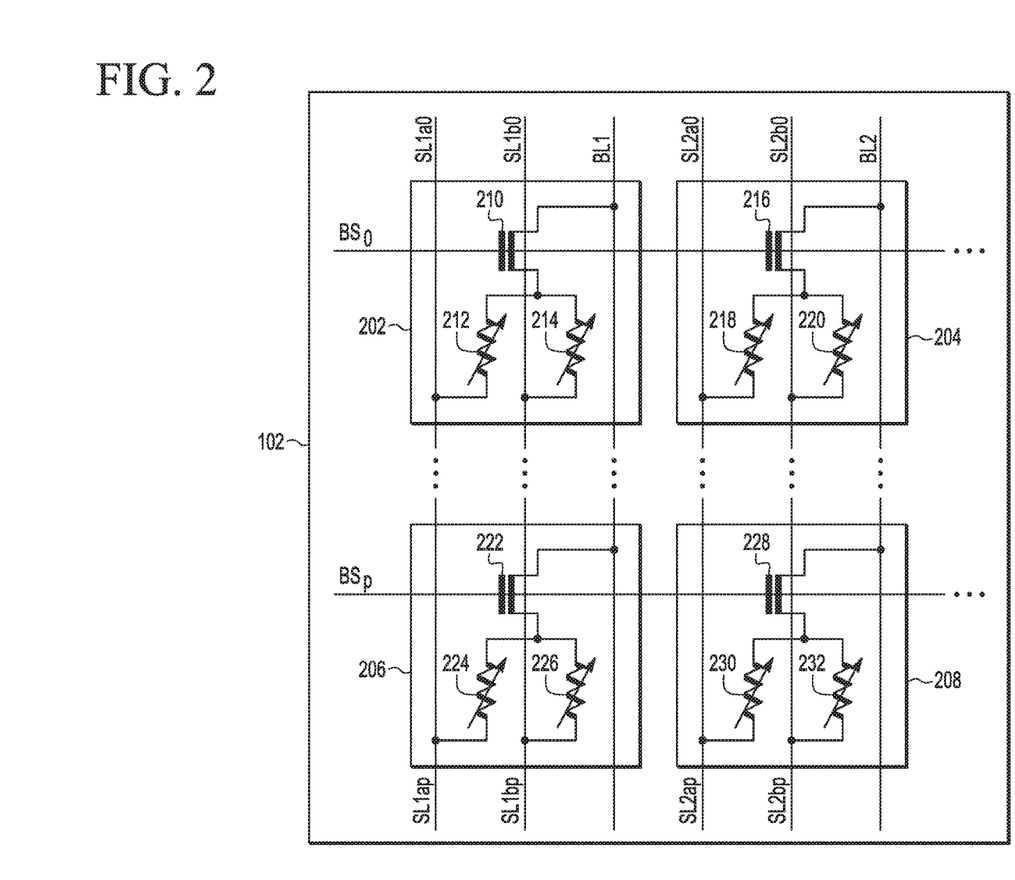
FIG. 2 is a schematic diagram of a portion of the array of NVM bit cells that can be used in the NVM flip flop system of FIG. 1.

FIG. 2 is a schematic diagram of a portion of NVM array 102 of NVM cells 202, 204, 206, 208 that can be used in the NVM flip flop system 100 of FIG. 1. NVM cell 202 includes pass transistor 210 and programmable resistive elements 212, 214. Pass transistor 210 includes a first current electrode coupled to a first bit line BL1, a second current electrode coupled to first terminals of resistive elements 212, 214, and a gate electrode coupled to a first bank select signal $BS_0$. A second terminal of resistive element 212 is coupled to a first source line SL1a0, and a second terminal of resistive element 214 is coupled to a first complementary source line SL1b0, that is a complement of first source line SL1a0.

NVM cell 204 includes pass transistor 216 and programmable resistive elements 218, 220. Pass transistor 216 includes a first current electrode coupled to a second bit line BL2, a second current electrode coupled to first terminals of resistive elements 218, 220, and a gate electrode coupled to the first bank select signal $BS_O$. A second terminal of resistive element 218 is coupled to a second source line SL2a0, and a second terminal of resistive element 220 is coupled to a second complementary source line SL2b0, that is a complement of second source line SL2a0.

NVM cell 206 includes pass transistor 222 and programmable resistive elements 224, 226. Pass transistor 222 includes a first current electrode coupled to a first bit line BL1, a second current electrode coupled to first terminals of resistive elements 224, 226, and a gate electrode coupled to a second bank select signal $BS_P$. A second terminal of resistive element 224 is coupled to a third source line SL1ap, and a second terminal of resistive element 226 is coupled to a third complementary source line SL1bp, that is a complement of third source line SL1ap.

NVM cell 208 includes pass transistor 228 and programmable resistive elements 230, 232. Pass transistor 228 includes a first current electrode coupled to a second bit line BL2, a second current electrode coupled to first terminals of resistive elements 230, 232, and a gate electrode coupled to the second bank select signal $BS_P$. A second terminal of resistive element 230 is coupled to a fourth source line SL2ap, and a second terminal of resistive element 232 is coupled to a fourth complementary source line SL2bp, that is a complement of second source line SL2ap.

The bank select signals $BS_O$, $BS_P$ can be set by a controller (not shown), or by read circuitry 104 during read or restore operations, or by write circuitry 122 during store or write operations. Programmable resistive elements 212, 214, 218, 220, 224, 226, 230, 232 can be implemented using magnetic tunnel junction resistors or other suitable resistive elements capable of retaining their programmed state without requiring power.

Figure 3:
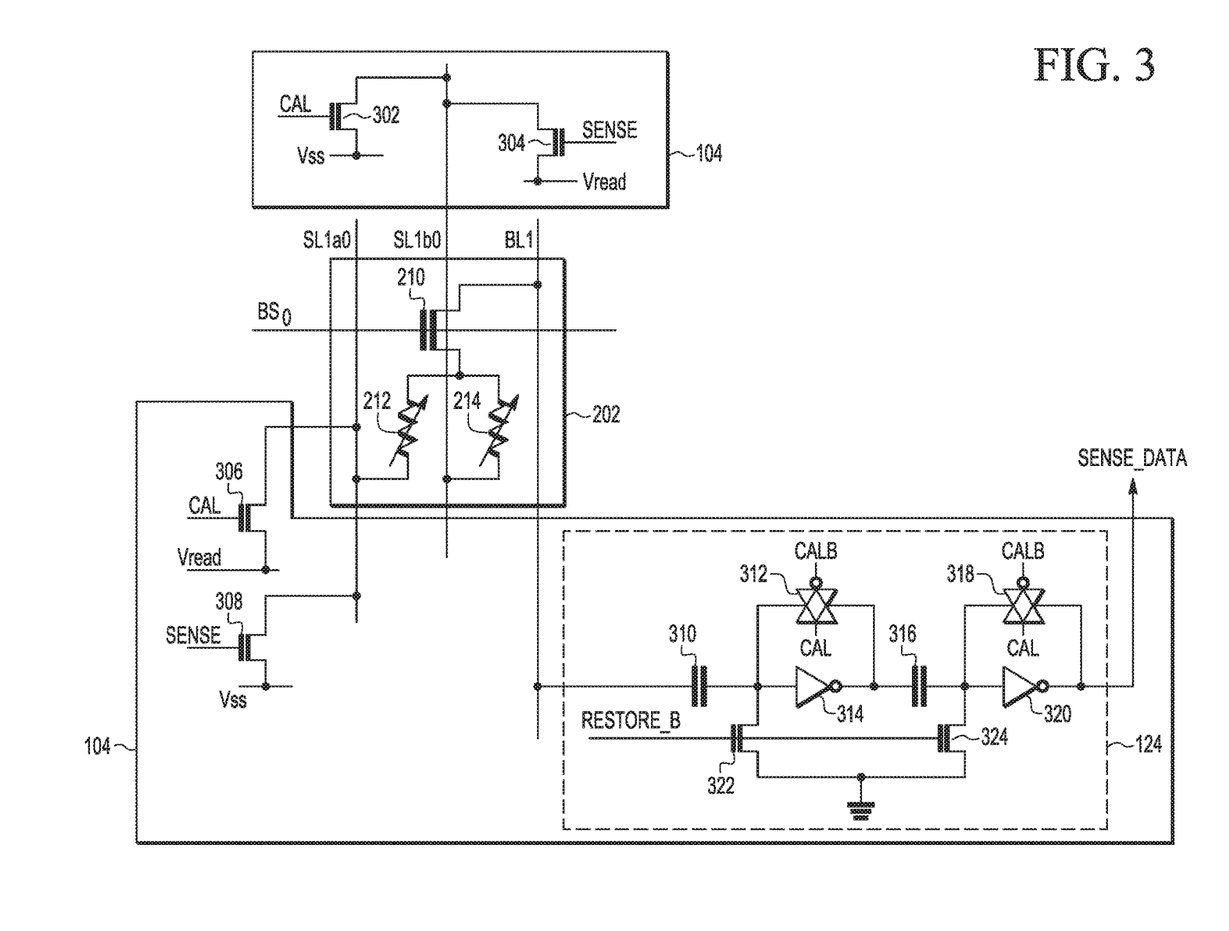
FIG. 3 is a schematic diagram of read circuitry coupled to a NVM bit cell that can be used in the NVM flip flop system of FIG. 1.

FIG. 3 is a schematic diagram of read circuitry 104 coupled to NVM cell 202 that can be used in the NVM flip flop system 100 of FIG. 1. Read circuitry 104 includes N-channel transistors 302, 304, 306, 308 and sense amplifier 124. N-channel transistor 302 has a first current electrode coupled to complementary source line SL1b0, a second current electrode coupled to supply voltage Vss, and a gate electrode coupled to calibration enable signal CAL. N-channel transistor 304 includes a first current electrode coupled to complementary source line SL1b0, a second current electrode coupled to read voltage Vread, and a gate electrode coupled to sense enable signal SENSE. N-channel transistor 306 includes a first current electrode coupled to source line SL1a0, a second current electrode coupled to read voltage Vread, and a control electrode coupled to the calibration enable signal CAL. N-channel transistor 308 includes a first current electrode coupled to source line SL1a0, a second current electrode coupled to supply voltage Vss, and a gate electrode coupled to the sense enable signal SENSE.

Sense amplifier 124 includes a first capacitor 310 with a first terminal coupled to bit line BL1 and a second terminal coupled to an input to inverting amplifier 314. An output of inverting amplifier 314 is coupled to a first terminal of capacitor 316, and a second terminal of capacitor is coupled to an input of inverting amplifier 320. Inverting amplifiers 314 and 320 may be implemented as logic inverters, or more generally could be any circuit providing negative voltage gain. An output of inverting amplifier 320 is data sensed on bit line BL1. The output of inverting amplifier 314 is coupled to a first terminal of transmission gate 312. A second terminal of transmission gate 312 is coupled to the input of inverting amplifier 314. The output of inverting amplifier 320 is the sensed data, and is also coupled to a first terminal of transmission gate 318. A second terminal of transmission gate 318 is coupled to the input of inverting amplifier 320. N-channel transistor 322 includes a first current electrode coupled to the input to inverting amplifier 314, a second current electrode coupled to ground, and a control electrode coupled to RESTOREB, which is a complement of a restore enable signal. The restore enable signal RESTORE is asserted to transfer data from NVM cells in array 102 to a respective bank of flip flop circuits 110-116. N-channel transistor 324 includes a first current electrode coupled to the input to inverting amplifier 320, a second current electrode coupled to ground and the second current electrode of transistor 322, and a gate electrode coupled to RESTOREB.

In NVM cell 202, pass transistor 210 includes a first current electrode coupled to bit line BL1, a second current electrode coupled to first terminals of resistive elements 214, 212, and a gate electrode coupled to bank select signal $BS_O$. A second terminal of resistive element 212 is coupled to source line SL1a0, and a second terminal of resistive element 214 is coupled to complementary source line SL1b0.

Each row of NVM cells can be used to backup and restore a bank or group of flip flop circuits. The number of NVM cells in a row can be equal to the number of flip flop circuits, and a corresponding error correction bits required for each of the flip flop circuits if error correction techniques are being used.

Figure 4:
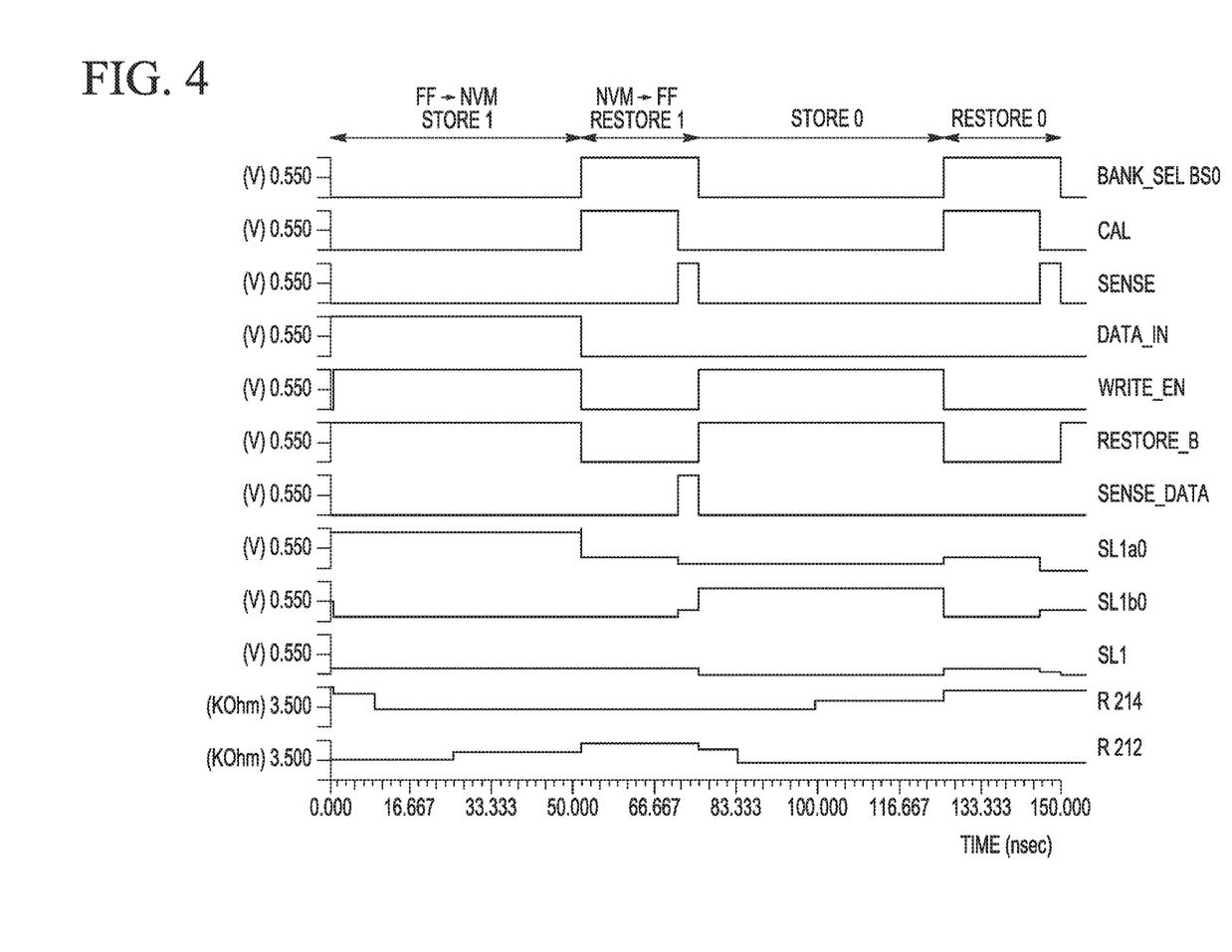
FIG. 4 is a timing diagram showing examples of store and restore operations for the NVM flip flop system of FIG. 1.

The operation of NVM cell 202 is now described with reference to FIGS. 1, 2 and 4. FIG. 4 illustrates a timing diagram of examples of store and restore operations. To store data representing a "1" from a flip flop circuit to NVM cell 202, bank select BS0, calibration enable CAL, and sense enable SENSE signals are low. Data input DATA_IN, write enable, and the RESTOREB signals are high. The sensed data signal is low. The source line signal SL1a0 is high and the complement of the source line signal SL1b0 and the bit line signals are low. The state of resistive element 214 changes from high resistance to low resistance, and the state of resistive element 212 changes from low resistance to high resistance.

To restore data representing a "1" from NVM cell 202 to a flip flop circuit, bank select signal BS0 and calibration enable signal CAL are high to enter a calibration phase in which SL1a0 is biased at Vread while the SL1b0 is biased at Vss. The voltage at the second current electrode of transistor 210 is thus biased at a level VCAL, which is equal to Vread*(R214/(R214+R212)), where R denotes the term "resistive element"). Since transistor 210 is ON, the voltage VCAL appears on BL1 as an input to the sense amplifier 124. During the sense phase, the sense enable signal SENSE is ON and the calibration enable signal CAL is OFF. During the calibration phase, the inverting amplifiers 314 and 320 are connected in unity gain mode (with transmission switches 312 and 318 being ON) and thus any sense circuit voltage offsets are captured during the calibration phase in the capacitors 310 and 316.

During the sense phase, SL1a0 is biased at Vss while the SL1b0 is biased at Vread. The voltage at the second current electrode of transistor 210 now gets biased to VSENSE=Vread*(R212/(R214+R212)). Also the transmission switches 312 and 318 are OFF and the voltage at the output (SENSE_DATA) of the sense amp is proportional to (VSENSE−VCAL) The sense enable SENSE and sensed data signals are initially low and transition high after the calibration enable CAL signal goes low. Data input DATA_IN, write enable, and the complement of the restore enable RESTOREB signals are low. Resistive element 214 is at a low resistance state, and resistive element 212 is in a high resistance state.

To store data representing a "0" from a flip flop circuit to NVM cell 202, bank select BS0, calibration enable CAL, sense enable SENSE, and data input DATA_IN signals are low. Write enable, and the complement of the restore enable RESTOREB signals are high. The sensed data signal SENSE_DATA is low. The source line signal SL1a0 is low, the complement of the source line signal SL1b0 is high, and the bit line signal BL1 is low. Resistance of resistive element 214 increases while resistance of resistive element 212 decreases.

To restore data representing a "0" from NVM cell 202 to a flip flop circuit, bank select signal BS0 and calibration enable signal CAL are high to enter the calibration phase as described hereinabove. The sense enable signal SENSE is initially low and transitions high after the calibration enable CAL signal goes low. Data input DATA_IN, write enable, the complement of the restore enable RESTOREB and the sensed data SENSE_DATA signals are low. Resistive element 214 is at a high resistance state, and resistive element 212 is in a low resistance state.

Control signals such as bank select, restore enable, write enable, calibration enable, sense enable, source line, and bit line signals, can be generated by a controller and/or within read circuitry 104 and/or write circuitry 122. NVM cells in array 102 can be written in parallel using the source lines SL1a0, SL1b0, SL2a0, SL2b0, SL1ap, SL1bp, SL2ap, SL2bp, and so on, associated with each row. Similarly, with sense amplifiers 124-128 being connected to each bit line, NVM cells in array 102 can be read in parallel, thus requiring the same amount of time to read and write independent of the number of NVM cells in each bank.

By now it should be appreciated that in selected embodiments, there has been provided an integrated circuit that can comprise a first plurality of flip flops, and a first bank of resistive memory cells. Each flip flop of the first plurality of flip flops uniquely corresponds to a resistive memory cell of the first bank of resistive memory cells. Write circuitry can be configured to store data from the first plurality of flip flops to the first bank of resistive memory cells. Read circuitry can be configured to read data from the first bank of resistive memory cells and provide the data from the first bank for storage into the first plurality of flip flops.

In another aspect, the integrated circuitry can further include a second plurality of flip flops; and
a second bank of resistive memory cells, wherein each flip flop of the second plurality of flip flops uniquely corresponds to a resistive memory cell of the second bank of resistive memory cells, wherein the write circuitry is configured to store data from the second plurality of flips flops to the second bank of resistive memory cells, and wherein the read circuitry is configured to read data from the second bank of resistive memory cells and provide the data from the second bank for storage into the second plurality of flip flops.

In another aspect, each resistive memory cell of the first bank is coupled to a first bank select line and each resistive memory cell of the second bank is coupled to a second bank select line.

In another aspect, the integrated circuitry can further include a bank select decoder coupled to the first and second plurality of flip flops, wherein the bank select decoder is configured to select the first plurality of flip flops when the first bank select line is asserted and the second plurality of flip flops when the second bank select line is asserted.

In another aspect, the first bank of resistive memory cells includes a plurality of bit lines in which a corresponding bit line of the plurality of bit lines is coupled to each resistive memory cell of the first bank of resistive memory cells, wherein the read circuitry comprises:
a plurality of sense amplifiers, wherein each sense amplifier of the plurality of sense amplifiers is coupled to a corresponding bit line of the plurality of bit lines.

In another aspect, the first bank of resistive memory cells includes a plurality of first source lines and a plurality of second source lines in which a corresponding first source line and a corresponding second source line is coupled to each resistive memory cell, and wherein each resistive memory cell of the first bank of resistive memory cells includes a first programmable resistive element coupled between the corresponding first source line and a corresponding internal node and a second programmable resistive element coupled between the corresponding second source line and the corresponding internal node.

In another aspect, the sense amplifiers are configured to perform differential sensing when reading the data from the first bank of resistive memory cells.

In another aspect, each resistive memory cell of the first bank includes a corresponding select transistor having a first current electrode coupled to the corresponding bit line, a second current electrode coupled to the corresponding internal node, and a control electrode coupled to receive a corresponding bank select line.

In another aspect, the first bank of resistive memory cells includes a first set of resistive memory cells configured to store data bits and a second set of resistive memory cells configured to store error correction bits, wherein a number of resistive cells configured to store data bits equals a number of flip flops in the first plurality of flip flops.

In another aspect, the integrated circuitry can further include a decoder, configured to receive the data bits from the first set and the error correction bits from the second set during a read of the first bank and using the error correction bits to determine if an error in the data bits exists.

In another aspect, the integrated circuitry can further include an encoder, configured to receive data from the first plurality of flip flops and generate error correction bits corresponding to the received data, wherein the write circuitry, during a write to the first bank, is configured to write the received data into the first set of resistive memory cells and the generated error corrections bits to the second set of resistive memory cells.

In another aspect, the read circuitry is configured to read the data from the first bank in parallel and the write circuitry if configured to store the data to the first plurality of flip flops in parallel.

In other selected embodiments, an integrated circuit can comprise a plurality of flip flop banks. Each flip flop bank can include a plurality of flip flops and is coupled to receive a flip flop bank select indicator. Each of a plurality of resistive memory cell banks can correspond uniquely with a flip flop bank and can be coupled to receive a resistive memory cell bank select indicator. The plurality of resistive memory cell banks can include a plurality of bit lines in which each bit line of the plurality of bit lines can be coupled to a corresponding resistive memory cell of each resistive memory cell bank. Write circuitry can be configured to store data from a selected flip flop bank indicated by the flip bank select indicator to a selected resistive memory cell bank indicated by the resistive memory cell bank indicator. Read circuitry can be configured to read data from the selected resistive memory cell bank and provide the data from the selected resistive memory cell bank for storage into the selected flip flop bank.

In another aspect, the read circuitry can comprise a plurality of sense amplifiers, wherein each sense amplifier of the plurality of sense amplifiers can be coupled to a corresponding bit line of the plurality of bit lines.

In another aspect, each resistive memory cell bank of the plurality of resistive memory banks includes a first set of resistive memory cells configured to store data bits and a second set of resistive memory cells configured to store error correction bits, wherein a number of resistive memory cells configured to store data bits in each resistive memory cell equals a number of flip flops in each flip flop bank.

In another aspect, the integrated circuitry can further include a decoder, configured to the receive the data bits from the first set of resistive memory cells and the error correction bits from the second set of resistive memory cells during a read of the selected resistive memory cell bank and using the error correction bits to determine if an error in the data bits exists.

In another aspect, the integrated circuitry can further include an encoder, configured to receive the data from the selected flip flop bank and generate error correction bits corresponding to the received data, wherein the write circuitry, during a write to the selected resistive memory bank, is configured to store the received data into the first set of resistive memory cells of the selected resistive memory bank and the generated error corrections bits to the second set of resistive memory cells of the selected resistive memory bank.

In still further selected embodiments, a method can include in response to initiating a power down, storing data bits from a first plurality of flip flops to a first bank of resistive memory cells, wherein each flip flop uniquely corresponds to a resistive memory cell; and in response to powering up, restoring the data bits from the first bank of resistive memory cells to the plurality of flip flops.

In another aspect, the method can further include, during the restoring the data bits, using a corresponding sense amplifier for each bit line of the first bank of resistive memory cells to sense the data bits.

In another aspect, the method can further include, during the restoring the data bits, reading error correction bits from the first bank of resistive memory cells in addition to the data bits and using the error correction bits to determine if there is an error in the data bits.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
  a first plurality of flip flops;
  a first bank of non-volatile resistive memory cells, wherein
    each flip flop of the first plurality of flip flops uniquely corresponds to a non-volatile resistive memory cell of the first bank of non-volatile resistive memory cells,
    each of the non-volatile memory cells include one or more programmable resistive elements that store data;
  a plurality of bit lines in which a corresponding bit line of the plurality of bit lines is coupled to each non-volatile resistive memory cell of the first bank of resistive memory cells;
  write circuitry configured to store data from the first plurality of flip flops to the first bank of non-volatile resistive memory cells; and read circuitry configured to read data from the first bank of non-volatile resistive memory cells and provide the data from the first bank for storage into the first plurality of flip flops, the read circuitry including a plurality of sense amplifiers, wherein each sense amplifier of the plurality of sense amplifiers is coupled to a corresponding bit line of the plurality of bit lines;
a plurality of first source lines and a plurality of second source lines in which a corresponding first source line and a corresponding second source line is coupled to each non-volatile resistive memory cell, and wherein each non-volatile resistive memory cell of the first bank of non-volatile resistive memory cells includes a first programmable resistive element coupled between the corresponding first source line and a corresponding internal node and a second programmable resistive element coupled between the corresponding second source line and the corresponding internal node.

2. The integrated circuitry of claim 1, further comprising:
a second plurality of flip flops; and
a second bank of non-volatile resistive memory cells, wherein each flip flop of the second plurality of flip flops uniquely corresponds to a non-volatile resistive memory cell of the second bank of non-volatile resistive memory cells, wherein the write circuitry is configured to store data from the second plurality of flips flops to the second bank of non-volatile resistive memory cells, and wherein the read circuitry is configured to read data from the second bank of non-volatile resistive memory cells and provide the data from the second bank for storage into the second plurality of flip flops.

3. The integrated circuit of claim 2, wherein each non-volatile resistive memory cell of the first bank is coupled to a first bank select line and each non-volatile resistive memory cell of the second bank is coupled to a second bank select line.

4. The integrated circuit of claim 3, further comprising a bank select decoder coupled to the first and second plurality of flip flops, wherein the bank select decoder is configured to select the first plurality of flip flops when the first bank select line is asserted and the second plurality of flip flops when the second bank select line is asserted.

5. The integrated circuit of claim 1, wherein the sense amplifiers are configured to perform differential sensing when reading the data from the first bank of non-volatile resistive memory cells.

6. The integrated circuit of claim 1, wherein each non-volatile resistive memory cell of the first bank includes a corresponding select transistor having a first current electrode coupled to the corresponding bit line, a second current electrode coupled to the corresponding internal node, and a control electrode coupled to receive a corresponding bank select line.

7. The integrated circuit of claim 1, wherein the first bank of non-volatile resistive memory cells includes a first set of non-volatile resistive memory cells configured to store data bits and a second set of non-volatile resistive memory cells configured to store error correction bits, wherein a number of resistive cells configured to store data bits equals a number of flip flops in the first plurality of flip flops.

8. The integrated circuit of claim 7, further comprising:
a decoder, configured to the receive the data bits from the first set and the error correction bits from the second set during a read of the first bank and using the error correction bits to determine if an error in the data bits exists.

9. The integrated circuit of claim 8, further comprising:
an encoder, configured to receive data from the first plurality of flip flops and generate error correction bits corresponding to the received data, wherein the write circuitry, during a write to the first bank, is configured to write the received data into the first set of non-volatile resistive memory cells and the generated error corrections bits to the second set of non-volatile resistive memory cells.

10. The integrated circuit of claim 1, wherein the read circuitry is configured to read the data from the first bank in parallel and the write circuitry if configured to store the data to the first plurality of flip flops in parallel.

11. An integrated circuit, comprising:
a plurality of flip flop banks, wherein each flip flop bank includes a plurality of flip flops and is coupled to receive a flip flop bank select indicator;
a plurality of non-volatile resistive memory cell banks, wherein each of the non-volatile resistive memory cell banks corresponds uniquely with a flip flop bank and is coupled to receive a non-volatile resistive memory cell bank select indicator, wherein the plurality of non-volatile resistive memory cell banks includes a plurality of bit lines in which each bit line of the plurality of bit lines is coupled to a corresponding non-volatile resistive memory cell of each non-volatile resistive memory cell bank, and each of the non-volatile memory cells include one or more programmable resistive elements that store data;
write circuitry configured to store data from a selected flip flop bank indicated by the flip flop bank select indicator to a selected non-volatile resistive memory cell bank indicated by the non-volatile resistive memory cell bank indicator;
read circuitry configured to read data from the selected non-volatile resistive memory cell bank and provide the data from the selected non-volatile resistive memory cell bank for storage into the selected flip flop bank, the read circuitry including a plurality of sense amplifiers, wherein each sense amplifier of the plurality of sense amplifiers is coupled to a corresponding bit line of the plurality of bit lines; and
a plurality of first source lines and a plurality of second source lines in which a corresponding first source line and a corresponding second source line is coupled to each non-volatile resistive memory cell, and wherein each non-volatile resistive memory cell of a first of the plurality of non-volatile resistive memory cell banks includes a first programmable resistive element coupled between the corresponding first source line and a corresponding internal node and a second programmable resistive element coupled between the corresponding second source line and the corresponding internal node.

12. The integrated circuit of claim 11, wherein the read circuitry comprises:
a plurality of sense amplifiers, wherein each sense amplifier of the plurality of sense amplifiers is coupled to a corresponding bit line of the plurality of bit lines.

13. The integrated circuit of claim 11, wherein each non-volatile resistive memory cell bank of the plurality of non-volatile resistive memory banks includes a first set of non-volatile resistive memory cells configured to store data bits and a second set of non-volatile resistive memory cells configured to store error correction bits, wherein a number of non-volatile resistive memory cells configured to store data bits in each resistive memory cell equals a number of flip flops in each flip flop bank.

14. The integrated circuit of claim 13, further comprising:
a decoder, configured to the receive the data bits from the first set of non-volatile resistive memory cells and the error correction bits from the second set of non-volatile resistive memory cells during a read of the selected non-volatile resistive memory cell bank and using the error correction bits to determine if an error in the data bits exists.

15. The integrated circuit of claim 14, further comprising:
an encoder, configured to receive the data from the selected flip flop bank and generate error correction bits corresponding to the received data, wherein the write circuitry, during a write to the selected non-volatile resistive memory bank, is configured to store the received data into the first set of resistive memory cells of the selected resistive memory bank and the generated error corrections bits to the second set of non-volatile resistive memory cells of the selected non-volatile resistive memory bank.

16. A method, comprising:
in response to initiating a power down, storing data bits from a first plurality of flip flops to a first bank of non-volatile resistive memory cells, wherein
  each flip flop uniquely corresponds to a non-volatile resistive memory cell, and each of the non-volatile memory cells include programmable resistive elements that store data, and
  a first source line and a second source line is coupled to each of the non-volatile resistive memory cells, and wherein each non-volatile resistive memory cell includes a first of the programmable resistive elements coupled between the corresponding first source line and a corresponding internal node and a second of the programmable resistive elements coupled between the corresponding second source line and the corresponding internal node; and
in response to powering up, restoring the data bits from the first bank of non-volatile resistive memory cells to the plurality of flip flops using read circuitry, the read circuitry including a plurality of sense amplifiers, each sense amplifier of the plurality of sense amplifiers is coupled to a corresponding bit line of a plurality of bit lines.

17. The method of claim 16, further comprising:
during the restoring the data bits, using a corresponding sense amplifier for each bit line of the first bank of non-volatile resistive memory cells to sense the data bits.

18. The method of claim 16, further comprising:
during the restoring the data bits, reading error correction bits from the first bank of non-volatile resistive memory cells in addition to the data bits and using the error correction bits to determine if there is an error in the data bits.

* * * * *